United States Patent
Namba

(10) Patent No.: US 9,165,800 B2
(45) Date of Patent: Oct. 20, 2015

(54) LIQUID PROCESSING METHOD, LIQUID PROCESSING APPARATUS AND STORAGE MEDIUM

(71) Applicant: Tokyo Electron Limited, Tokyo (JP)

(72) Inventor: Hiromitsu Namba, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 105 days.

(21) Appl. No.: 14/060,956

(22) Filed: Oct. 23, 2013

(65) Prior Publication Data

US 2014/0048109 A1 Feb. 20, 2014

Related U.S. Application Data

(62) Division of application No. 12/631,219, filed on Dec. 4, 2009, now abandoned.

(30) Foreign Application Priority Data

Dec. 8, 2008 (JP) .................................. 2008-312182

(51) Int. Cl.
*H01L 21/67* (2006.01)
*H01L 21/687* (2006.01)

(52) U.S. Cl.
CPC .... *H01L 21/67051* (2013.01); *H01L 21/68742* (2013.01); *H01L 21/68792* (2013.01)

(58) Field of Classification Search
CPC ................. H01L 21/67051; H01L 21/68792; H01L 21/68742
USPC ............................ 134/26, 30, 33, 36, 37, 145
See application file for complete search history.

(56) References Cited

U.S. PATENT DOCUMENTS

| | | | |
|---|---|---|---|
| 5,997,653 A | 12/1999 | Yamasaka | |
| 2003/0226577 A1 * | 12/2003 | Orll et al. | 134/1.3 |

FOREIGN PATENT DOCUMENTS

| | | | | |
|---|---|---|---|---|
| JP | 9-199471 A | | 7/1997 | |
| JP | 09199471 A | * | 7/1997 | ............ H01L 21/304 |
| JP | 09-330904 A | | 12/1997 | |
| JP | 2000-156362 A | | 6/2000 | |
| JP | 2007-317927 A | | 12/2007 | |
| JP | 2008-112837 A | | 5/2008 | |
| JP | 2008112837 A | * | 5/2008 | |

\* cited by examiner

*Primary Examiner* — Michael Kornakov
*Assistant Examiner* — Katelyn Whatley
(74) *Attorney, Agent, or Firm* — Abelman, Frayne & Schwab

(57) ABSTRACT

Disclosed is a liquid processing method which includes holding the substrate by a holding part, rotating the substrate held by the holding part through a rotation driving part, and supplying a chemical liquid to a holding part-side surface of the substrate by a chemical liquid supply part. After the supply of the chemical liquid, rinsing liquid droplets are generated and supplied between the holding part and the substrate by supplying gas toward the holding part-side surface of the substrate from a gas supply part and, at the same time, supplying a rinsing liquid toward the holding part-side surface of the substrate from a rinsing liquid supply part. After the supply of the rinsing liquid droplets, the gas supply is halted and a rinsing liquid is additionally supplied to the holding part-side surface of the substrate from the rinsing liquid supply part.

7 Claims, 3 Drawing Sheets

LIQUID PROCESSING METHOD, LIQUID PROCESSING APPARATUS AND STORAGE MEDIUM

CROSS REFERENCE TO RELATED APPLICATIONS

This application is a divisional of U.S. patent application Ser. No. 12/631,219, filed Dec. 4, 2009, which claims priority from Japanese Application No. 2008-312182, filed on Dec. 8, 2008, both of which are incorporated herein by reference.

TECHNICAL FIELD

The present disclosure relates to a liquid processing method for processing a substrate by rotating the substrate and supplying a cleaning liquid to a holding part-side surface of the substrate, a liquid processing apparatus for performing such a liquid processing method, and a storage medium for executing the liquid processing method by such a liquid processing apparatus.

BACKGROUND

Generally, a substrate processing apparatus performs a chemical liquid treatment by rotating a substrate and supplying a chemical liquid to the substrate, and then performs a cleaning treatment by supplying a cleaning liquid (a rinsing liquid) to the substrate. The substrate processing apparatus includes a substrate holding means (a holding part) for holding several points of the outer circumferential end of the substrate, a rotating means (a rotation driving part) for rotating the substrate held by the substrate holding means, a chemical liquid supply means for supplying the chemical liquid to near the center of the rear side of the substrate held by the substrate holding means, and a cleaning liquid supply means for supplying the cleaning liquid to near the center of the rear side of the substrate held by the substrate holding means. For example, see Japanese Laid-Open Patent Publication No. Hei 9-330904.

The chemical liquid supplied to the rear side of the substrate is scattered and adhered to a base member (a support plate) disposed at the rear side of the substrate, and the chemical liquid adhered to the base member is adhered to a substrate which has been subjected to a drying process, or has a bad influence on the substrate to be subsequently processed.

The present disclosure provides a liquid processing method to clean a member, such as a holding plate, disposed at the holding part-side of the substrate with a rinsing liquid and prevent a chemical liquid adhered to such a member from adhering to a substrate which has been subjected to a drying process, or from having a bad influence on the substrate (polluting the substrate). Also, the present disclosure provides a liquid processing apparatus for performing such a liquid processing method, and a storage medium for executing such a liquid processing method by the liquid processing apparatus.

SUMMARY

According to one embodiment, a liquid processing method is provided. The liquid processing method includes holding a substrate by a holding part, rotating the substrate held by the holding part through a rotation driving part, supplying a chemical liquid to a holding part-side surface of the substrate by a chemical liquid supply mechanism, supplying gas toward the holding part-side surface of the substrate by a gas supply part after the chemical liquid supply, supplying a rinsing liquid toward the holding part-side surface of the substrate by a rinsing liquid supply mechanism to generate rinsing liquid droplets, supplying the generated rinsing liquid droplets to the holding part-side surface of the substrate, and additionally supplying a rinsing liquid to the holding part-side surface of the substrate by the rinsing liquid supply mechanism after the rinsing liquid droplet supply.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
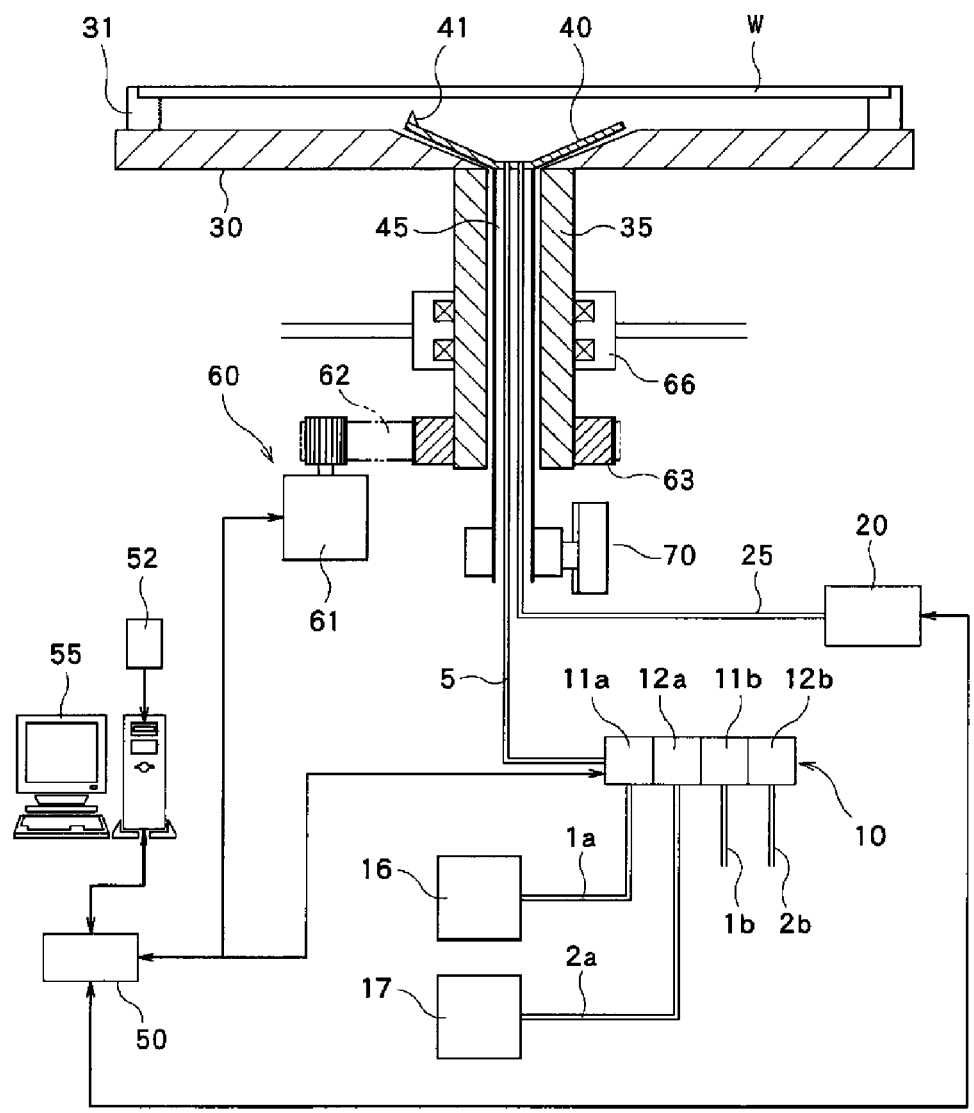
FIG. 1 is a schematic view illustrating the configuration of a liquid processing apparatus according to one embodiment.

In the following detailed description, reference is made to the accompanying drawings, which form a part hereof. The illustrative embodiments described in the detailed description, drawings, and claims are not meant to be limiting. Other embodiments may be utilized, and other changes may be made, without departing from the spirit or scope of the subject matter presented here.

According to one embodiment, a liquid processing method is provided. The liquid processing method includes holding a substrate by a holding part, rotating the substrate held by the holding part through a rotation driving part, supplying a chemical liquid to a holding part-side surface of the substrate by a chemical liquid supply mechanism, generating and supplying rinsing liquid droplets to the holding part-side surface of the substrate by supplying gas toward the holding part-side surface of the substrate through a gas supply part and supplying a rinsing liquid toward the holding part-side surface of the substrate through a rinsing liquid supply mechanism after the supply of the chemical liquid, and additionally supplying a rinsing liquid to the holding part-side surface of the substrate by the rinsing liquid supply mechanism after the supply of the rinsing liquid droplets.

According to another embodiment, a liquid processing apparatus is provided. The liquid processing apparatus includes a holding part to hold a substrate, a rotation driving part to rotate the holding part, a chemical liquid supply mechanism to supply a chemical liquid to the substrate, a rinsing liquid supply mechanism to supply a rinsing liquid to the substrate, a gas supply part to supply gas to a holding part-side surface of the substrate, and a control device to control the rotation driving part, the chemical liquid supply mechanism, the rinsing liquid supply mechanism, and the gas supply part so that the rotation driving part rotates the substrate held by the holding part, the chemical liquid supply mechanism supplies the chemical liquid to the holding part-side surface of the substrate, rinsing liquid droplets is generated and supplied to the holding part-side surface of the substrate by supplying the gas toward the holding part-side surface of the substrate through the gas supply part and supplying the rinsing liquid toward the holding part-side surface of the substrate through the rinsing liquid supply mechanism, and the rinsing liquid supply mechanism supplies the rinsing liquid to the holding part-side surface of the substrate.

According to still another embodiment, there is provided a storage medium storing a computer program to execute a liquid processing method by a liquid processing apparatus. The liquid processing method includes holding a substrate by a holding part, rotating the substrate held by the holding part through a rotation driving part, supplying a chemical liquid to a holding part-side surface of the substrate by a chemical liquid supply mechanism, generating and supplying rinsing liquid droplets to the holding part-side surface of the substrate by supplying gas toward the holding part-side surface of the substrate through a gas supply part and supplying a rinsing liquid toward the holding part-side surface of the substrate through a rinsing liquid supply mechanism after the supply of the chemical liquid, and additionally supplying a rinsing liquid to the holding part-side surface of the substrate by the rinsing liquid supply mechanism after the supply of the rinsing liquid droplets.

According to one embodiment, since rinsing liquid droplets are generated by supplying gas to the holding part-side surface of the substrate by a gas supply part and by supplying a rinsing liquid toward the holding part-side surface of the substrate by a rinsing liquid supply part, a member disposed at the holding part-side of the substrate, such as a holding plate, can be cleaned by a rinsing liquid. Therefore, it is possible to prevent the chemical liquid adhered to such a member from adhering to a substrate which has been subjected to a drying process, or to prevent such a chemical liquid from having a bad influence on the substrate (from polluting the substrate).

Figure 2:
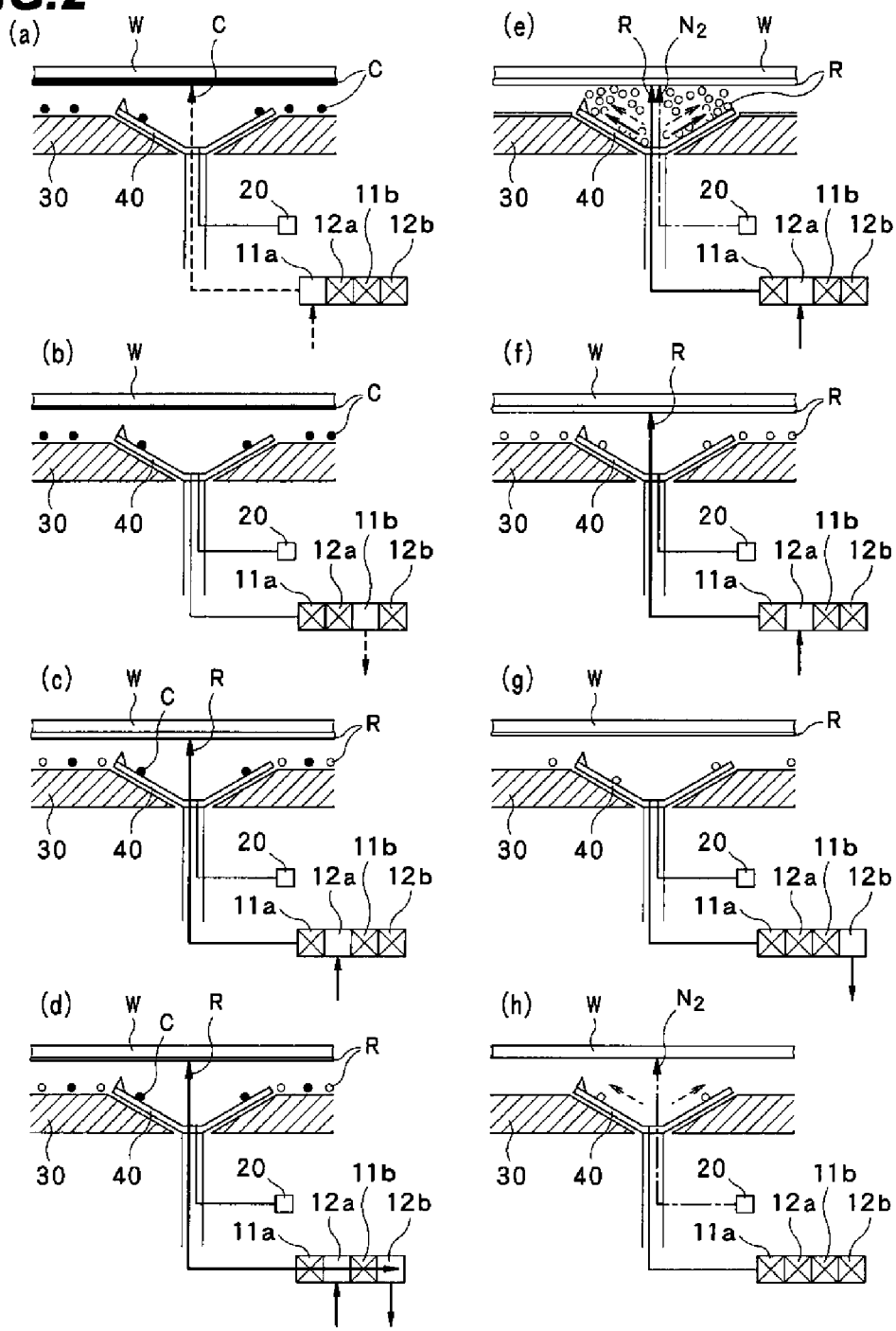
FIG. 2 is a schematic view illustrating aspects of a liquid processing method according to another embodiment.
Figure 3:
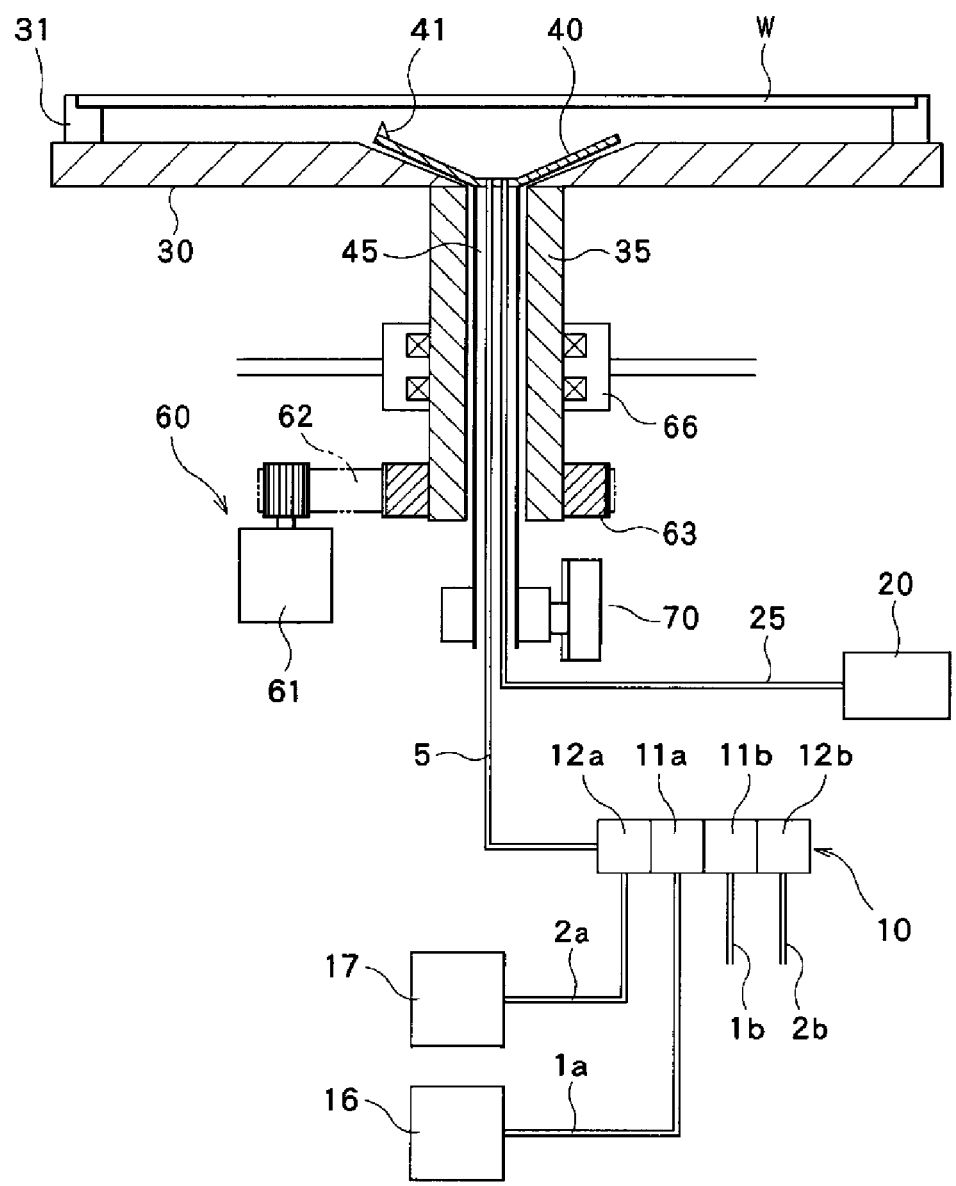
FIG. 3 is a schematic view illustrating the configuration of a liquid processing apparatus according to still another embodiment.

Hereinafter, embodiments of a liquid processing method, a liquid processing apparatus, and a storage medium according to the present disclosure will be described with reference to drawings. Herein, FIGS. 1 to 3 are drawings showing an embodiment of the present disclosure.

As shown in FIG. 1, the liquid processing apparatus includes a hollow-shaped holding plate 30 to hold a semiconductor wafer W as a substrate (hereinafter, referred to as a wafer W) by a holding part 31, a hollow-shaped rotating shaft 35 fixedly connected to holding plate 30, and a rotation driving part 60 to rotatably drive rotating shaft 35 in a rotation direction.

Rotation driving part 60, as shown in FIG. 1, has a pulley 63 disposed at the outside of the circumferential periphery of rotating shaft 35, and a motor 61 to give driving power to pulley 63 through a driving belt 62. Also, a bearing 66 is disposed at the outside of the circumferential periphery of rotating shaft 35.

Also, as shown in FIG. 1, within the hollow of holding plate 30, a lift pin plate 40 having a lift pin 41 is disposed to move up and down wafer W during loading/unloading. Also, within the hollow of rotating shaft 35, a lift shaft 45 fixedly connected to lift pin plate 40 extends in up and down directions. Also, although only one lift pin 41 is shown in FIG. 1, several (for example, three) lift pins 41 may be disposed along the circumferential direction of lift pin plate 40 at equal intervals.

Also, as shown in FIG. 1, within lift shaft 45 and lift pin plate 40, a cleaning liquid supply pipe 5 to supply a cleaning liquid C or R (see FIG. 2) toward the lower surface (holding part 31-side surface) of wafer W held by holding plate 30 (or a chemical liquid supply pipe during the supply of a chemical liquid C) extends in up and down directions. Also, as shown in FIG. 1, a gas supply pipe 25 to supply inert gas including $N_2$ or Ar, or air (in FIG. 2(e), and FIG. 2(h), inert gas $N_2$ is shown) to the opposed surface (the lower surface) of wafer W held by holding plate 30 extends within lift shaft 45 and lift pin plate 40. Also, a gas supply part 20 to supply gas to gas supply pipe 25 is connected to gas supply pipe 25. Herein, the gas to be supplied to wafer W may include inert gas.

In the present disclosure, the cleaning liquid C or R means a chemical liquid C or a rinsing liquid R. Concentrated hydrofluoric acid, diluted hydrofluoric acid, ammonia-hydrogen peroxide solution (SC1), hydrochloric acid-hydrogen peroxide solution (SC2), organic solvent may be used as chemical liquid C. Deionized water (DIW) may be used as rinsing liquid R.

Also, as shown in FIG. 1, a chemical liquid supply part 16 to supply chemical liquid C via a multi-valve 10 and a rinsing liquid supply part 17 to supply rinsing liquid R via multi-valve 10 are connected to cleaning liquid supply pipe 5. More specifically, a chemical liquid supply pipe 1a is connected to chemical liquid supply part 16, and cleaning liquid supply pipe 5 is connected to chemical liquid supply pipe 1a via multi-valve 10. Likewise, a rinsing liquid supply pipe 2a is connected to rinsing liquid supply part 17, and cleaning liquid supply pipe 5 is connected to rinsing liquid supply pipe 2a via multi-valve 10. Also, in the present embodiment, chemical liquid supply part 16, chemical liquid supply pipe 1a, a chemical liquid supply valve 11a (which will be described later), and cleaning liquid supply pipe 5 constitute a chemical liquid supply mechanism, and rinsing liquid supply part 17, rinsing liquid supply pipe 2a, a rinsing liquid supply valve 12a (which will be described later), and cleaning liquid supply pipe 5 constitute a rinsing liquid supply mechanism.

Also, as shown in FIG. 1, a chemical liquid discharge pipe 1b to discharge chemical liquid C within cleaning liquid supply pipe 5 and multi-valve 10, and a rinsing liquid discharge pipe 2b to discharge rinsing liquid R within cleaning liquid supply pipe 5 and multi-valve 10 are connected to multi-valve 10. Chemical liquid C or rinsing liquid R, discharged as described above, may be treated as drainage, or may be re-used by returning to chemical liquid supply part 16 or rinsing liquid supply part 17. Also, in accordance with an aspect of the present embodiment, discharged chemical liquid C is re-used by returning to chemical liquid supply part 16, and discharged rinsing liquid R is treated as drainage.

Also, in the present disclosure, multi-valve 10 means that it has multiple valves, and each of the valves can be independently opened and closed. Also, in the present embodiment, multi-valve 10 includes chemical liquid supply valve 11a provided between chemical liquid supply pipe 1a and cleaning liquid supply pipe 5 to be capable of opening and closing, rinsing liquid supply valve 12a provided between rinsing liquid supply pipe 2a and cleaning liquid supply pipe 5 to be capable of opening and closing, a chemical liquid discharge valve 11b provided between cleaning liquid supply pipe 5 and chemical liquid discharge pipe 1b to be capable of opening and closing, and a rinsing liquid discharge valve 12b provided between cleaning liquid supply pipe 5 and rinsing liquid discharge pipe 2b to be capable of opening and closing.

Also, as shown in FIG. 1, an elevating member 70 to move up/down lift pin plate 40 and lift shaft 45 and dispose them at the upper and lower positions is provided at lift shaft 45.

Hereinafter, the operation and effect of the present embodiment having the above described configuration will be described.

First, elevating member 70 sets the position of lift pin plate 40 to an upper position (to which wafer W is transferred by a wafer carrying robot (not shown)) (a first upper position setting process). More specifically, elevating member 70 sets the position of lift shaft 45 to an upper position, and thereby the position of lift pin plate 40 fixedly connected to lift shaft 45 is set to the upper position.

Then, wafer W is loaded on lift pin 41 of lift pin plate 40 by the wafer carrying robot (not shown) (a loading process), and lift pin 41 supports the lower surface of wafer W (a first supporting process).

Next, elevating member 70 sets the position of lift pin plate 40 to a lower position (at which wafer W is treated with the cleaning liquid C or R) (a lower position setting process). More specifically, elevating member 70 sets the position of lift shaft 45 to a lower position, and thereby the position of lift pin plate 40 fixedly connected to lift shaft 45 is set to the lower position.

While the position of lift pin plate 40 is set to the lower position, as described above, wafer W is held by holding part 31 of holding plate 30 (a holding process) (see FIG. 1).

Then, rotating shaft 35 is rotatably driven by rotation driving part 60, thereby rotating wafer W held by holding plate 30 (a rotating process) (see FIG. 1). Also, while wafer W held by holding plate 30 is rotated as described above, the following processes are performed.

First, chemical liquid supply part 16 supplies chemical liquid C to the lower surface of wafer W (holding part 31-side surface) (a chemical liquid supply process) (see FIG. 2(a)). More specifically, in the state where chemical liquid supply valve 11a of multi-valve 10 is opened, and rinsing liquid supply valve 12a, chemical liquid discharge valve 11b, and rinsing liquid discharge valve 12b are closed, chemical liquid C is supplied from chemical liquid supply part 16. Accordingly, chemical liquid C supplied from chemical liquid supply part 16 is supplied to the lower surface of wafer W by sequentially passing through chemical liquid supply pipe 1a, multi-valve 10, and cleaning liquid supply pipe 5.

Also, chemical liquid C supplied to the lower surface of wafer W flows from the center toward the outer circumferential periphery on the lower surface of wafer W by the centrifugal force applied to wafer W. Accordingly, although the lower surface of wafer W is treated with chemical liquid C, chemical liquid C is scattered and adhered to lift pin plate 40 (including lift pin 41) and holding plate 30 disposed at the lower surface side of wafer W.

Then, chemical liquid C supplied by the chemical liquid supply process is discharged (a chemical liquid discharge process) (see FIG. 2(b)). More specifically, chemical liquid discharge valve 11b of multi-valve 10 is placed in an open state, and chemical liquid supply valve 11a, rinsing liquid supply valve 12a, and rinsing liquid discharge valve 12b are placed in a closed state, thereby discharging chemical liquid C within cleaning liquid supply pipe 5 and multi-valve 10 to chemical liquid discharge pipe 1b. Also, in the present embodiment, chemical liquid C discharged as described above is re-used by returning to chemical liquid supply part 16.

Next, rinsing liquid supply part 17 supplies rinsing liquid R to the lower surface of wafer W (a preliminary rinsing liquid supply process) (see FIG. 2(c)). More specifically, in the state where rinsing liquid supply valve 12a of multi-valve 10 is opened, and chemical liquid supply valve 11a, chemical liquid discharge valve 11b, and rinsing liquid discharge valve 12b are closed, rinsing liquid R is supplied from rinsing liquid supply part 17. Accordingly, rinsing liquid R supplied from rinsing liquid supply part 17 is supplied to the lower surface of wafer W by sequentially passing through rinsing liquid supply pipe 2a, multi-valve 10, and cleaning liquid supply pipe 5.

Rinsing liquid R supplied to the lower surface of wafer W, as described above, also flows from the center toward the outer circumferential periphery on the lower surface of wafer W by the centrifugal force applied to wafer W. Accordingly, the reaction by chemical liquid C on the lower surface of wafer W can be quickly stopped. In the present embodiment, since the preliminary rinsing liquid supply process to supply a large quantity of rinsing liquid R to the lower surface of wafer W at a stroke is performed before a valve rinsing process (which will be described later) where the amount of rinsing liquid R supplied to the lower surface of wafer W is small, the reaction of the lower surface of wafer W with chemical liquid C may be quickly stopped.

Then, in the state where both rinsing liquid supply valve 12a and rinsing liquid discharge valve 12b of multi-valve 10 are opened, and chemical liquid supply valve 11a and chemical liquid discharge valve 11b are closed, rinsing liquid R is supplied from rinsing liquid supply part 17 (see FIG. 2(d)). Accordingly, a part of rinsing liquid R supplied from rinsing liquid supply part 17 is supplied to the lower surface of wafer W while the residual part of rinsing liquid R supplied from rinsing liquid supply part 17 flows toward rinsing liquid discharge pipe 2b within multi-valve 10 (a valve rinsing process).

As described above, according to the present embodiment, since rinsing liquid R supplied from rinsing liquid supply part 17 flows toward rinsing liquid discharge pipe 2b within multi-valve 10, the inside of multi-valve 10 may be rinsed by rinsing liquid R. Therefore, it is possible to completely remove chemical liquid C adhered to the inside of multi-valve 10 without prolonging the time for supplying rinsing liquid R from rinsing liquid supply part 17, and also to perform the processing of wafer W with a high throughput, without overetching.

If the valve rinsing process is not carried out, the time for supplying rinsing liquid R from rinsing liquid supply part 17 (time for the preliminary rinsing process and the following additional rinsing process) is required to be prolonged to remove chemical liquid C adhered to the inside of multi-valve 10. Thus, the throughput for the processing of wafer W is reduced. Meanwhile, according to the present embodiment, since rinsing liquid R supplied from rinsing liquid supply part 17 is allowed to flow toward rinsing liquid discharge pipe 2b within multi-valve 10, it is possible to completely rinse the inside of multi-valve 10 by rinsing liquid R within a short time, and to perform the processing of wafer W with a high throughput without overetching.

Also, in the valve rinsing process, the continuous supply of rinsing liquid R to the lower surface of wafer W in the state where rinsing liquid supply valve 12a is opened is to prevent the lower surface of wafer W from drying at the stage when chemical liquid C is not completely removed from the lower surface of wafer W.

As described above, when the valve rinsing process is completed, gas (for example, $N_2$) is supplied to the lower surface of the wafer W by gas supply part 20, and rinsing liquid R is also supplied to the lower surface of wafer W by rinsing liquid supply part 17. More specifically, in the state where rinsing liquid supply valve 12a of multi-valve 10 is opened and chemical liquid supply valve 11a, chemical liquid discharge valve 11b, and rinsing liquid discharge valve 12b are closed, rinsing liquid supply part 17 supplies rinsing liquid R, and gas supply part 20 supplies gas. Accordingly, rinsing liquid droplets are generated and supplied to the lower surface of wafer W (a rinsing liquid droplet supply process) (see FIG. 2(e)).

As described above, since rinsing liquid R and the gas are simultaneously supplied to holding part 31-side surface of wafer W, the advancing direction of rinsing liquid R supplied from the upper end of cleaning liquid supply pipe 5 is scattered by a force of the gas diffusing from the upper end of gas supply pipe 25 toward the outer circumferential periphery. Thus, rinsing liquid R is dispersed into the droplets and spread in all directions (see FIGS. 1 and 2(*e*)).

Accordingly, rinsing liquid R supplied from cleaning liquid supply pipe 5 is scattered on wafer W, lift pin plate 40, and holding plate 30, and collides with lift pin plate 40 (including lift pin 41) and holding plate 30. Also, rinsing liquid R adhered to lift pin plate 40 flows toward holding plate 30 by the spiral flow generated by the rotation of holding plate 30 and wafer W, and rinsing liquid R on holding plate 30 flows toward the outer circumferential periphery by the centrifugal force applied to holding plate 30. Therefore, lift pin plate 40 (including lift pin 41) and holding plate 30 are completely cleaned in their entireties by rinsing liquid R.

As a result, in a second supporting process (which will be described later), it is possible to prevent chemical liquid C adhered to lift pin 41 from adhering to the lower surface of wafer W when lift pin 41 comes in contact with the lower surface of wafer W. Also, it is possible to prevent chemical liquid C adhered to holding plate 30 from adhering, by the rotation of holding plate 30, to wafer W which has been subjected to a drying process (which will be described later), or to prevent chemical liquid C adhered to lift pin plate 40 or holding plate 30 from having a bad influence on wafer W to be subsequently processed (polluting wafer W).

As described above, after the rinsing liquid droplet supply process is performed, rinsing liquid supply part 17 supplies rinsing liquid R to the lower surface of wafer W (a additional rinsing liquid supply process) (see FIG. 2(*f*)). More specifically, in the state where rinsing liquid supply valve 12*a* of multi-valve 10 is opened and chemical liquid supply valve 11*a*, chemical liquid discharge valve 11*b*, and rinsing liquid discharge valve 12*b* are closed, rinsing liquid supply part 17 supplies rinsing liquid R. Accordingly, rinsing liquid R supplied from rinsing liquid supply part 17 is supplied to the lower surface of wafer W by sequentially passing through rinsing liquid supply pipe 2*a*, multi-valve 10, and cleaning liquid supply pipe 5.

Rinsing liquid R supplied to the lower surface of wafer W, as described above, flows from the center toward the outer circumferential periphery on the lower surface of wafer W by the centrifugal force applied to wafer W. Then, rinsing liquid R in an amount greater than that of rinsing liquid R supplied to the lower surface of wafer W in the valve rinsing process and the rinsing liquid droplet supply process, is supplied to the lower surface of wafer W at a stroke to completely clean chemical liquid C adhered to the lower surface of wafer W.

In the present embodiment, after the valve rinsing process is performed, the rinsing liquid droplet supply process and the additional rinsing liquid supply process are performed. Thus, it is possible to efficiently clean lift pin plate 40, holding plate 30, and the lower surface of wafer W by rinsing liquid R. Since lift pin plate 40 and holding plate 30 are cleaned by rinsing liquid R (the rinsing liquid droplet supply process) and the lower surface of wafer W is cleaned (the additional rinsing liquid supply process) after the complete cleaning of chemical liquid C within multi-valve 10, it is possible to clean lift pin plate 40, holding plate 30, and the lower surface of wafer W by high purity rinsing liquid R. As a result, lift pin plate 40, holding plate 30, and the lower surface of wafer W can be efficiently cleaned by rinsing liquid R.

After the additional rinsing liquid supply process is performed as described above, rinsing liquid R supplied in the additional rinsing liquid supply process is discharged (a rinsing liquid discharge process) (see FIG. 2(*g*)). More specifically, rinsing liquid discharge valve 12*b* of multi-valve 10 is placed in an open state, and chemical liquid supply valve 11*a*, rinsing liquid supply valve 12*a*, and chemical liquid discharge valve 11*b* are placed in a closed state, thereby discharging rinsing liquid R within cleaning liquid supply pipe 5 and multi-valve 10 to rinsing liquid discharge pipe 2*b*. Also, in the present embodiment, rinsing liquid R discharged as described above is treated as drainage.

Then, gas supply part 20 supplies gas to the lower surface of wafer W (the drying process) (see FIG. 2(*h*)). When the gas is supplied for a specified amount of time, the supply of the gas is stopped, and the rotation of rotating shaft 35 by rotation driving part 60 is stopped.

Next, lift pin plate 40 is moved up by elevating member 70, and wafer W is supported and lifted by lift pin 41 of lift pin plate 40 (the second supporting process). Then, the position of lift pin plate 40 is set to the upper position (from which wafer W is transferred to a wafer carrying robot (not shown)) (a second upper position setting process). Then, wafer W on lift pin 41 is unloaded by the wafer carrying robot (not shown) (an unloading process).

In the present embodiment, a computer program to execute the above described respective processes (from the first upper position setting process to the second upper position setting process) of the liquid processing method is stored in a storage medium 52 (see FIG. 1). Also, the liquid processing apparatus includes a computer 55 connected to storage medium 52, and a control device 50 to control the liquid processing apparatus itself (at least, rotation driving part 60, multi-valve 10, and gas supply part 20) by receiving a signal from computer 55. Accordingly, when above-described storage medium 52 is inserted in (or attached to) the computer 55, it is possible to execute the above-described series of liquid processing processes in the liquid processing apparatus by control device 50. Also, in the present disclosure, storage medium 52 includes CD, DVD, MD, hard disk, or RAM.

Also, although multi-valve 10 has chemical liquid supply valve 11*a*, rinsing liquid supply valve 12*a*, chemical liquid discharge valve 11*b*, and rinsing liquid discharge valve 12*b* in order from one end (the left in FIG. 1) to the other end (the right in FIG. 1) in the above description, multi-valve 10 is not limited thereto. For example, as shown in FIG. 3, multi-valve 10 may have rinsing liquid supply valve 12*a*, chemical liquid supply valve 11*a*, chemical liquid discharge valve 11*b*, and rinsing liquid discharge valve 12*b* in order from one end (the left in FIG. 3) to the other end (the right in FIG. 3).

According to above described multi-valve 10, in the valve rinsing process, since rinsing liquid R flown into multi-valve 10 can be discharged from rinsing liquid supply valve 12*a* disposed at one end of multi-valve 10 to rinsing liquid discharge valve 12*b* disposed at the other end of multi-valve 10, it is possible to more efficiently clean the inside of multi-valve 10 by rinsing liquid R, and to carry out the processing of wafer W with higher throughput.

Also, in the present embodiment, cleaning liquid supply pipe 5 and gas supply pipe 25 are mutually parallel provided within lift shaft 45 and lift pin plate 40, and the advancing direction of rinsing liquid R supplied from the upper end of cleaning liquid supply pipe 5 is scattered by a force of the gas diffusing from the upper end of gas supply pipe 25 toward the outer circumferential periphery, thereby dispersing rinsing liquid R into droplets in all directions.

However, the present disclosure is not limited thereto. For example, in accordance with another aspect, cleaning liquid supply pipe 5 and gas supply pipe 25 may integrally formed within lift shaft 45 or within lift pin plate 40. In this case, the rinsing liquid and the gas are mixed with each other in the portion where cleaning liquid supply pipe 5 and gas supply pipe 25 are integrally formed. Accordingly, the advancing direction of rinsing liquid R supplied from the upper end of cleaning liquid supply pipe 5 (or gas supply pipe 25) is scattered by a force of the gas diffusing from the upper end of cleaning liquid supply pipe 5 (or gas supply pipe 25) toward the outer circumferential periphery, thereby dispersing rinsing liquid R into droplets in all directions.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
   a holding part configured to hold a substrate;
   a rotation driving part configured to rotate the substrate held by the holding part;
   a chemical liquid supply mechanism configured to supply a chemical liquid toward a holding part-side surface of the substrate;
   a rinsing liquid supply mechanism including a liquid supply pipe and configured to supply a rinsing liquid toward the holding part-side surface of the substrate;
   a gas supply part including a gas supply pipe provided in parallel with and separately from the liquid supply pipe and configured to supply gas toward the holding part-side surface of the substrate;
   a lift pin plate including a lift pin provided within a hollow of the holding part to have a shape increasingly being widened toward an upper direction and configured to move the substrate in an up and down direction during a loading/unloading process, and the liquid supply pipe and the gas supply pipe are provided within the lift pin plate such that an opening for each of the liquid supply pipe and the gas supply pipe is formed on a bottom surface of the lift pin plate; and
   a control device configured to control an overall operation of the rotation driving part, the chemical liquid supply mechanism, the rinsing liquid supply mechanism, and the gas supply part such that the rotation driving part rotates the substrate held by the holding part, the chemical liquid supply mechanism supplies the chemical liquid toward the holding part-side surface of the substrate, and after supplying the chemical liquid, rinsing liquid droplets are generated within the lift pin plate and scattered toward an outer circumferential periphery of the holding part between the holding part and the substrate to clean the holding part in all directions by supplying the gas toward the holding part-side surface of the substrate through the gas supply part and supplying the rinsing liquid toward the holding part-side surface of the substrate through the rinsing liquid supply mechanism, and after scattering the rinsing liquid droplets, the gas supply part stops the supplying of the gas, the rinsing liquid supply mechanism additionally supplies the rinsing liquid to the holding part-side surface of the substrate, and the substrate is rotated and dried by the rotation driving part.

2. The liquid processing apparatus of claim 1, wherein the chemical liquid supply mechanism has a chemical liquid supply pipe to guide the chemical liquid toward the holding part-side surface of the substrate, and the control device controls the chemical liquid supply pipe so that the chemical liquid within the chemical liquid supply pipe is discharged before the supply of the rinsing liquid droplets.

3. The liquid processing apparatus of claim 1, wherein the control device controls the rinsing liquid supply mechanism so that a rinsing liquid is preliminarily supplied to the holding part-side surface of the substrate before the supply of the rinsing liquid droplets.

4. The liquid processing apparatus of claim 1, wherein the control device controls the gas supply part so that, during the drying of the substrate by rotation of the substrate, gas is supplied to the holding part-side surface of the substrate after the additional supply of the rinsing liquid.

5. A liquid processing apparatus comprising:
   a holding part configured to hold a substrate;
   a rotation driving part configured to rotate the substrate held by the holding part;
   a multi-valve system configured to supply a chemical liquid toward a holding part-side surface of the substrate and including at least a chemical liquid supply valve, a chemical liquid discharge valve, a rinsing liquid supply valve, and a rinsing liquid discharge valve;
   a gas supply part configured to supply gas toward the holding part-side surface of the substrate;
   a lift pin plate including a lift pin provided within a hollow of the holding part to have a shape increasingly being widened toward an upper direction and configured to move the substrate in an up and down direction during a loading/unloading process, and a liquid supply pipe connected to the multi-valve system and a gas supply pipe connected to the gas supply part are provided within the lift pin plate such that an opening for each of the liquid supply pipe and the gas supply pipe is formed on a bottom surface of the lift pin plate; and
   a control device configured to control an overall operation of the rotation driving part, the multi-valve system, and the gas supply part,
   wherein the control device controls the rotation driving part, the multi-valve system, and the gas supply part such that the rotation driving part rotates the substrate held by the holding part, the multi-valve system supplies the chemical liquid toward the holding part-side surface of the substrate through the chemical liquid supply valve,
   after supplying the chemical liquid, the multi-valve system supplies a rinsing liquid toward the holding part-side surface of the substrate through the rinsing liquid supply valve while discharging the rinsing liquid at the same time through the rinsing liquid discharge valve,
   after supplying and discharging the rinsing liquid at the same time, the gas supply part supplies gas toward the holding part-side surface of the substrate, and the multi-valve system supplies the rinsing liquid toward the holding part-side surface of the substrate at the same time, thereby generating rinsing liquid droplets within the lift pin plate and scattering the rinsing liquid droplets toward an outer periphery of the holding part between the holding part and the substrate to clean the holding part,
   after scattering the rinsing liquid droplets, the gas supply part stops the supplying of the gas and the multi-valve system additionally supplies a rinsing liquid to the holding part-side surface of the substrate, and the substrate is rotated and dried by the rotation driving part.

6. The liquid processing apparatus of claim 5, wherein the control device further controls the multi-valve system such that the rinsing liquid is preliminarily supplied toward the holding part-side surface of the substrate before the supply of the rinsing liquid droplets.

7. The liquid processing apparatus of claim 5, wherein the control device further controls the multi-valve system such that, when supplying the rinsing liquid toward the holding part-side surface of the substrate through the rinsing liquid supply valve while discharging the rinsing liquid at the same time through the rinsing liquid discharge valve, the rinsing liquid supply valve and the rinsing liquid discharge valve are opened while the chemical liquid supply valve and the chemical liquid discharge valve are closed.

* * * * *